United States Patent
Strömer et al.

(10) Patent No.: US 9,748,486 B2
(45) Date of Patent: Aug. 29, 2017

(54) ORGANIC LIGHT EMITTING DEVICE WITH INCREASED LIGHT OUT COUPLING

(71) Applicant: KONINKLIJKE PHILIPS N.V., Eindhoven (NL)

(72) Inventors: Jan Frank Strömer, Frankfurt am Main (DE); Marcus Antonius Verschuuren, Berkel-Enschot (NL); Dagobert Michel De Leeuw, Mainz (DE); Thomas Nicolaas Maria Bernards, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 6 days.

(21) Appl. No.: 14/958,071

(22) Filed: Dec. 3, 2015

(65) Prior Publication Data
US 2016/0087210 A1 Mar. 24, 2016

Related U.S. Application Data

(62) Division of application No. 13/642,000, filed as application No. PCT/IB2011/051744 on Apr. 21, 2011, now Pat. No. 9,219,249.

(51) Int. Cl.
*H01L 21/00* (2006.01)
*H01L 51/00* (2006.01)
(Continued)

(52) U.S. Cl.
CPC ...... *H01L 51/0015* (2013.01); *H01L 51/5048* (2013.01); *H01L 51/5265* (2013.01);
(Continued)

(58) Field of Classification Search
CPC ........... H01L 2251/105; H01L 51/5275; H01L 2251/558; H01L 51/5048; H01L 51/5265;
(Continued)

(56) References Cited

U.S. PATENT DOCUMENTS 7,269,062 B2 9/2007 Liao et al.
7,332,369 B2 2/2008 Veres et al.
(Continued)

FOREIGN PATENT DOCUMENTS

GB 2344691 A 6/2000
JP 2002110362 A 4/2002
(Continued)

OTHER PUBLICATIONS

T. Hoefler et al: "Modifying the Output Characteristics of an Organic Light-Emitting Device by Refractive-Index Modulation", Advanced Functional Materials, Wiley—V C H Verlag GmbH & Co. KGAA, DE, vol. 16, No. 18, Dec. 4, 2006, pp. 2369-2373, XP001504252.
(Continued)

*Primary Examiner* — Duy T Nguyen

(57) ABSTRACT

The invention relates to an organic light-emitting device (OLED) comprising at least: a first electrode; a second electrode; an organic light emissive layer arranged between said first electrode and said second electrode; and an organic charge transport layer arranged between said first electrode and said emissive layer, wherein i) the charge transport layer is patterned or provided with a periodic surface structure on a surface of the charge transport layer facing the emissive layer, and/or ii) an alignment layer which allows for charge transport to the emissive layer is provided between said charge transport layer and said emissive layer, which alignment layer promotes alignment of the optical dipoles of molecules of said light emissive layer towards a common preferred direction of the molecular axes. The use of the patterned or structured charge transport layer and/or the alignment layer provides improved light out coupling from the OLED layer stack, i.e. increased external quantum efficiency.

9 Claims, 1 Drawing Sheet

(51) Int. Cl.
*H01L 51/50* (2006.01)
*H01L 51/52* (2006.01)
*H01L 51/56* (2006.01)

(52) U.S. Cl.
CPC .......... *H01L 51/5275* (2013.01); *H01L 51/56* (2013.01); *H01L 51/5056* (2013.01); *H01L 51/5293* (2013.01); *H01L 2251/105* (2013.01); *H01L 2251/558* (2013.01)

(58) Field of Classification Search
CPC ............. H01L 51/5293; H01L 51/0015; H01L 51/5056; H01L 51/56
See application file for complete search history.

(56) References Cited

U.S. PATENT DOCUMENTS

| | | |
|---|---|---|
| 7,470,933 B2 | 12/2008 | Lee et al. |
| 7,629,061 B2 | 12/2009 | Gupta et al. |
| 2002/0030442 A1 | 3/2002 | Koyama et al. |
| 2003/0091752 A1 | 5/2003 | Nealey et al. |
| 2006/0003487 A1 | 1/2006 | Chung |
| 2006/0084347 A1 | 4/2006 | Tutt et al. |
| 2008/0203902 A1* | 8/2008 | De Kok ............. H01L 51/5036 313/504 |
| 2008/0265757 A1 | 10/2008 | Forrest et al. |
| 2009/0218561 A1 | 9/2009 | Kitamura et al. |
| 2009/0267507 A1 | 10/2009 | Takashima et al. |
| 2009/0280586 A1 | 11/2009 | Coe-Sullivan |
| 2010/0084672 A1* | 4/2010 | Ueno ................. H01L 51/5012 257/98 |
| 2011/0011148 A1* | 1/2011 | Chen ........................ B44C 1/20 72/352 |

FOREIGN PATENT DOCUMENTS

| | | |
|---|---|---|
| JP | 2002313554 A | 10/2002 |
| JP | 2003100458 A | 4/2003 |
| JP | 2004265641 A1 | 9/2004 |
| JP | 2005286154 A | 10/2005 |
| JP | 2007141736 A | 6/2007 |
| JP | 2008034701 A | 2/2008 |

OTHER PUBLICATIONS

M. Kitamura et al; "Enhanced Luminance Efficiency of Organic Light-Emitting Diodes With Two-Dimensional Photonic Crystals", Japanese Journal of Applied Physics, Japan Society of Applied Physics, vol. 44, No. 4B, Apr. 1, 2005, pp. 2844-2848, XP001245861.

Ghassan E. Jabbour; "Screen Printing for the Fabrication of Organic Light-Emitting Devices", IEEE Journal on Selected Topics in Quantum Electronics, vol. 7, No. 5, Sep./Oct. 2001, pp. 769-773.

Leeann Kim et al; "Contact Printing of Quantum Dot Light-Emitting Devices", Nano Letters, Nov. 19, 2008.

Hiroyuki Okada et al: "Self-Alignment Technologies of Organic Electronic Devices and Its Integrated Panels", Journal of Photopolymer Science and Technology, vol. 18, No. 1, 2005, pp. 79-92.

Daisuke Yokoyama et al; "Spectrally Narrow Emissions At Cutoff Wavelength From Edges of Optically and Electrically Pumped Anisotropic Organic Films", Journal of Applied Phys. vol. 103, pp. 103-123, 2008.

Marc Verschuuren et al; "3D Photonic Structures by Sol-Gel Imprint Lithography", Mater. Res. Soc. Symp. Proc., vol. 1002, 2007, pp. 7-12.

Daniel Kafer et al; "A Comprehensive Study of Self-Assembled Monolayers of Anthraceneethiol on Gold: Solvent Effects, Structures, and Stability", Journal Am. Chem. Soc., vol. 128, No. 5, 2006, pp. 1723-1732.

Stephen Y. Chou et al; "Nanoimprint Lithography", Journal Vac. Sci. Technol., 1996, B, vol. 14, No. 6, pp. 4129-4133.

Helmut Schift; "Nanoimprint Lithography: An Old Story in Modern Times? A Review", Journal Vac. Sci. Technol. B, vol. 26, No. 2, Mar./Apr. 2008, pp. 458-480.

Jan Haisma et al; "Mold-Assisted Nanolithography: A Process for Reliable Pattern Replication", Journal Vac. Sci. Technology, 1996, B, vol. 14, No. 6, pp. 4124-4128.

Ulrich Denker "Organic Semiconductor Sources: Hybrid OLEDs Combine Vapor Deposition With Solution Processing" Laser Focus World, Sep. 1, 2008.

* cited by examiner

ORGANIC LIGHT EMITTING DEVICE WITH INCREASED LIGHT OUT COUPLING

CROSS-REFERENCE TO PRIOR APPLICATIONS

This application is a divisional application of U.S. Pat. No. 9,219,249, filed on Oct. 18, 2012, which a U.S. National Phase application under 35 U.S.C. §371 of International Application No. PCT/IB2011/051744, filed on Apr. 21, 2011. These applications are hereby incorporated by reference herein.

FIELD OF THE INVENTION

The present invention relates to an organic light-emitting device (OLED) that is adapted to provide increased light out coupling, and to a method for producing such a device.

BACKGROUND OF THE INVENTION

Light emitting diode (LED) based light-emitting devices are today increasingly used for a wide variety of lighting applications. In particular, organic light-emitting devices (OLEDs) are increasingly used for signage lighting, such as advertising information and indication signs.

For commercialization of OLEDs, device efficiency is an important parameter. The total device efficiency is determined by the internal quantum efficiency and the external quantum efficiency (light out coupling). In recent years many techniques have been proposed to improve the internal quantum efficiency, including for example doping of transport layers to increase charge recombination, and the use of triplet-emitter by which almost 100% internal quantum efficiency can be achieved. Also to improve the external quantum efficiency numerous techniques have been proposed, including particular stack designs for reducing external quantum efficiency roll-off of triplet-emitters based on reduced triplet-triplet annealing, and by choosing various layers with refractive indices and thicknesses such as to reduce reflection of the emitted light at the layer interfaces. For example, U.S. Pat. No. 7,269,062 suggests a heterostructure organic device created by depositing organic material for e.g. a hole transport layer via inkjet or other techniques, and then cross-linking the deposited organic material to render it insoluble. The process can be repeated for sequential deposition of layers. The cross-linked layers allow flexibility in choosing the band gaps and refractive indices of the various materials to control the position of the recombination zone and also the optical confinement of the photons emitted, which can lead to improvement in both internal and external quantum efficiency.

However, a problem with existing devices is that still, a relatively large portion of light remains trapped in the organic layers or the glass substrate due to total internal refection at layers interfaces. Hence the need for improvement of external quantum efficiency in OLEDs remains.

SUMMARY OF THE INVENTION

It is an object of the present invention to overcome this problem, and to provide an OLED having improved light out coupling efficiency.

According to a first aspect of the invention, this and other objects are achieved by an OLED comprising at least:
a first electrode;
a second electrode;
an organic light emissive layer arranged between said first electrode and said second electrode; and
an organic charge transport layer arranged between said first electrode and said emissive layer, wherein the charge transport layer is patterned or provided with a periodic surface structure on a surface of the charge transport layer facing the emissive layer. Alternatively or additionally to the charge transport layer being patterned or provided with said periodic surface structure, the OLED may comprise an alignment layer which allows for charge transport to the emissive layer and which is provided between said charge transport layer and said emissive layer, which alignment layer promotes alignment of the optical dipoles of the molecules of said light emissive layer towards a common preferred direction.

The present invention may increase the light out coupling efficiency of the OLED by different mechanisms. Some embodiments may be optimized to promote increased out coupling predominantly by one of said mechanisms, whereas other embodiments may be adapted to utilize two or more mechanisms simultaneously to achieve the improved light out coupling. Said mechanisms include:
  adapting the refractive properties of the emissive layer/ charge transport layer interface, e.g. to increase the critical angle of total internal reflection for light incident on this interface from the emissive layer, such that more light can be transmitted through to the charge transport layer and also to the glass substrate,
  utilizing photonic crystal characteristics of the charge transport layer, said characteristics including suppressed optical density of states in the in plane direction of the charge transport layer and enhanced optical density of states in directions corresponding to incidence angles (at the emissive layer/charge transport layer interface) smaller than the critical angle of total internal reflection, such that more light is transmitted through to the charge transport layer instead of being trapped in the emissive layer,
  alignment of the optical dipoles of the emitter molecules in a common preferred direction thereby directing emission of light in directions having incidence angles which does not result in substantial or total reflection at the charge transport layer interface.

Each of the above mechanisms results in improved extraction of light from the emissive layer, and each of these mechanisms may be achieved by patterning the charge transport layer or providing it with a periodic surface structure on a surface thereof facing the emissive layer.

Additionally, said alignment of optical dipoles may also be achieved by an alignment layer provided in direct contact with the emissive layer, typically between the charge transport layer and the emissive layer. Thus, the invention also relates to an OLED comprising at least:
a first electrode;
a second electrode;
an organic light emissive layer arranged between said first electrode and said second electrode; and
an organic charge transport layer, or an organic charge transport layer assembly comprising a charge transport layer and an additional layer, said charge transport layer or charge transport layer assembly being arranged between said first electrode and said emissive layer and adapted to promote alignment of the optical dipoles of molecules of said light emissive layer towards a common preferred direction, wherein i) the charge transport layer is patterned, or provided with a periodic surface structure on a surface of the charge transport layer facing the emissive layer, which pattern or structure promotes said alignment, and/or ii) said additional layer of the charge transport layer assembly is an alignment layer which promotes said alignment and which is provided between said charge transport layer and said emissive layer.

Alignment of the optical dipoles is typically achieved by self-alignment of the molecules of the emissive layer such that their molecular axes point in a common preferred direction.

Where the optical dipoles of the molecules of the emissive layer are aligned towards a common preferred direction, the light generated by said dipoles in the emissive layer is emitted in a certain direction. By controlling the alignment of the molecular axes and thus also the optical dipoles of the emitter molecules, the direction of emission may be controlled to a direction in which more light is transmitted to the adjacent layers and not trapped by light guiding within the emissive layer. Hence, more light can be extracted from the emissive layer compared to the case where the molecules of the emissive layer are less ordered.

Typically, said alignment layer may be provided between the charge transport layer and the emissive layer and in direct contact with both the charge transport layer and the emissive layer. In order to ensure charge transport through to the emissive layer, the alignment layer may comprise a monolayer.

The preferred dimensions of the pattern or periodic surface structure may vary depending on which of the above mechanisms is/are to be favored. In embodiments of the invention, the periodic structure of the charge transport layer has period dimensions in the range of from 10 angstrom (Å) to 100 nm, which is suitable for increasing light out coupling efficiency by promoting alignment of emitter molecules. In other embodiments of the invention the periodic structure of the charge transport layer may have period dimensions in the range of from 1 nm to 100 μm, for example from 1 nm to 1 μm.

In embodiments of the invention, in particular where the light out coupling efficiency is to be increased one of mechanism 1) or 2) described above, the charge transport layer may have a refractive index which is lower than the refractive indices of any other of said layers of the OLED. The low refractive index of the charge transport layer contributes to increasing the critical angle of total internal reflection at the emissive layer/charge transport layer interface. In such embodiments the periodic structure of the charge transport layer may have period dimensions in the range of from 1 nm to 100 μm, for example from 1 nm to 1 μm.

In embodiments of the invention, the charge transport layer may form a photonic crystal. In such embodiments, the optical density of states of the photonic crystal in the in-plane direction may be suppressed by the charge transport layer being patterned or provided with said surface structure, and/or the optical density of states in directions with angles smaller than the critical angle of total internal reflection ($\theta_c$), defined with respect to the layer normal, may be enhanced by the charge transport layer being patterned or provided with said surface structure. Thus, propagation of light originating from the emissive layer through to the hole transport layer is enhanced. In such embodiments the periodic structure of the charge transport layer may have period dimensions in the range of from 1 nm to 100 μm, for example from 1 nm to 1 μm.

In another aspect, the invention provides a method of producing an OLED as described herein, comprising the steps of a) providing a first electrode layer on a substrate to form the basis of a layer stack;

b) forming a charge transport layer on said layer stack;

c) patterning said charge transport layer or embossing said charge transport layer with a surface structure; or forming an alignment layer on said charge transport layer;

d) forming a light emissive layer on said patterned or embossed charge transport layer, or forming a light emissive layer on said alignment layer whereby molecular axes of molecules of said light emissive layer are aligned towards a common preferred direction; and e) providing a second electrode layer on said layer stack.

The embossing of step c) may be performed using a nanoimprint technique.

In embodiments of the invention, at least one of said layers is solution processed. Since solution processing is more convenient than vacuum deposition of layers, the production process is rendered more simple and less expensive. Also, solution processing can produce smooth layers of the desired thickness in one step. In particular, the charge transport layer may be solution processed. Thus, in embodiments of the invention, at least the step b) may be performed using a solution processing technique. Furthermore, at least one of steps d) and e) may be performed using a vacuum processing technique.

It is noted that the invention relates to all possible combinations of features recited in the claims.

BRIEF DESCRIPTION OF THE DRAWINGS

These and other aspects of the present invention will now be described in more detail, with reference to the appended drawings showing embodiment(s) of the invention.

As illustrated in the figures, the sizes of layers and regions are exaggerated for illustrative purposes and, thus, are provided to illustrate the general structures of embodiments of the present invention.

DETAILED DESCRIPTION

The present inventors have found that the light out coupling efficiency of an OLED can be improved by providing a layer adjacent the emissive layer, typically a layer located between the emissive layer and the anode, such as a hole transport layer, with an embossed periodic surface structure or by patterning said layer. It has also been found that, alternatively or additionally to the charge transport layer being patterned or provided with said periodic surface structure, the light out coupling efficiency of an OLED can be improved by incorporating an alignment layer between said charge transport layer and said emissive layer, which alignment layer promotes alignment of the optical dipoles of molecules of said light emissive layer towards a common preferred direction.

Figure 1:
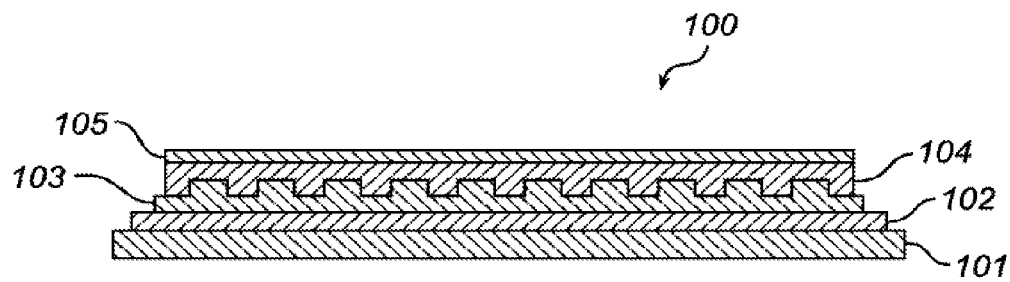
FIG. 1 shows a cross-sectional side view of a device according to an embodiment of the present invention.

FIG. 1 illustrates in cross-section an organic light-emitting device according to the present invention. The OLED 100 is arranged on a conventional substrate 101 for bottom-emissive configuration, e.g. a glass substrate. On the substrate 101 is provided a translucent anode 102, typically made of indium-tin-oxide (ITO), an organic hole transport layer 103, an organic light emissive layer 104 and a conventional cathode 105, typically made of metal. It is envisaged that the device could also include one or more additional charge transport or charge blocking layers, located either between the anode 102 and the emissive layer 104 (e.g. a hole injection layer or an electron blocking layer) or between the emissive layer 104 and the cathode 105 (e.g. electron injection or transport layers or hole blocking layer), or both.

The organic light-emitting device of the invention may be a small molecule OLED (smOLED) or a polymeric organic light-emitting device (PLED).

The hole transport layer 103 may be produced by a solution processing technique or by a vacuum deposition technique. Typically, the hole transport layer is provided using a conventional solution processing technique, such as spin-coating, ink-jet printing, screen printing, dipping, etc.

Furthermore, the hole transport layer (HTL) 103 is provided with a surface structure forming a periodic pattern of the surface of the HTL facing the emissive layer. The period dimension of the structure may be in the range of from 1 nm to 100 nm. The surface structure may be provided by embossing, thus resulting in an embossed surface structure, e.g. using a nanoimprint lithography technique. The maximum thickness of the HTL is typically in the range of 1 nm to 1 μm, for example about 100 nm. The desirable thickness depends on the material of the HTL as well as the overall design or structure of the device.

Without being bound to any particular theory, it is believed that the increase in external quantum efficiency may be achieved mainly by different mechanisms in different embodiments of the invention, depending on the characteristics of the hole transport layer.

For example, in embodiments of the invention, the hole transport layer 103 may have a refractive index which is lower than the refractive index of the adjacent emissive layer 104. The combination of low index of refraction and patterning or surface structuring of the hole transport layer ensures that as much light as possible is not trapped within the hole transport layer but transmitted through to the transparent substrate. The anode (typically ITO) may have a refractive index that is similar to that of the emissive layer.

In another embodiment of the invention, the hole transport layer 103 may form a photonic crystal. In such a photonic crystal, the fact that the hole transport layer is patterned or provided with a surface structure as described above, may suppress the optical density of states in the in-plane direction, and/or enhance the optical density of states in directions with incidence angles smaller than the critical angle of total internal reflection ($\theta_c$, defined relative to the layer normal). Thus, propagation of light originating from the emissive layer through to the hole transport layer is enhanced.

A photonic crystal HTL may have a refractive index that is lower than the refractive index of the emissive layer 104.

Figure 2:
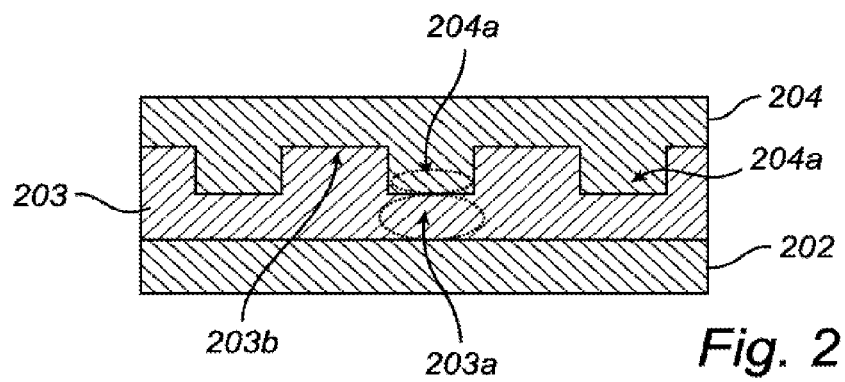
FIG. 2 shows a cross-sectional side view of a device according to another embodiment of the present invention.
Figure 3:
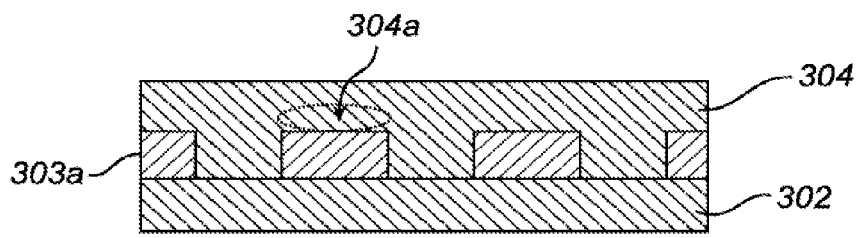
FIG. 3 shows a cross-sectional side view of part of a device according to another embodiment of the present invention.

In embodiments of the invention using a photonic crystal as described above, the structured surface of the hole transport layer may be adapted to provide patterned emission sites within the emissive layer. FIG. 2 shows part of an OLED comprising a structured hole transport layer 203 in direct contact with an emissive layer 204. Due to the structured features some regions 203a of the HTL 203 has smaller layer thickness than other regions 203b. Since the smaller thickness of regions 203a provides the lowest resistivity for holes, holes will preferentially be injected via regions 203a and emission will thus preferentially occur in the regions 204a of the emissive layer that are adjacent the regions 203a of the hole transport layer. In another embodiment shown in FIG. 3, the small thickness regions of the hole transport layer has been removed, e.g. by anisotropic reactive-ion etching, to produce a patterned (discontinuous) hole transport layer. Here, holes will only be injected though the regions 303a of remaining hole transport layer, and thus light will be emitted from the regions 304a of the emissive layer adjacent said regions 303a of the HTL. Such spatial distribution of local emission zones allows controlling the direction of constructive interference of light. Hence, constructive interference of light can be achieved in directions having an incidence angle on the emissive layer/HTL interface which is smaller than the critical angle of total internal reflection. Furthermore, destructive interference can be achieved in directions having an incidence angle which is larger than the critical angle of total internal reflection. Thus, the direction of emission can be adapted such that total internal reflection at the emissive layer-HTL interface is reduced, minimized or completely avoided.

As used herein "patterned" with reference to a layer is intended to mean that the layer is discontinuous, forming a pattern on its underlying surface, e.g. being formed by removal of selected portions of an initial continuous layer by lithography or etching.

As used herein, "surface structured" or "embossed" with reference to a layer is intended to mean that the layer is partially patterned to produce an imprint or embossing on the layer surface, but without removing a complete layer thickness so as to expose a surface of an underlying layer or substrate. Hence, a surface structured or embossed layer may be continuous.

Furthermore, the present inventors have found that the light out coupling efficiency of an OLED can also be improved by causing molecules of the emissive layer to be ordered such that the molecular axes of the emitter molecules are aligned towards a common preferred direction. By alignment of the molecular axes of the molecules of the emissive layer, the optical dipoles of the molecules are aligned and hence light is emitted in a predetermined direction. Consequently, by promoting or controlling the alignment of the molecular axes, the direction of light emission can be promoted or controlled so as to increase emission of light in direction(s) not resulting in total internal reflection, and accordingly reduce or avoid emission of light in directions resulting in total internal reflection, thus increasing the light out coupling efficiency.

The preferred direction of the aligned optical dipoles relative to the preferred direction of the aligned molecular axes may depend on the material used, and these directions may differ from each other.

Said alignment of the emitter molecules may be achieved by deposition of the emissive layer onto a hole transport layer which has been embossed with a periodic surface structure which promotes said alignment. Thus, the patterning or surface structuring of the HTL described above with reference to FIG. 1 may also contribute to alignment of optical dipoles, thereby increasing the light out coupling efficiency by the mechanism described above.

However, it is contemplated that different dimensions of the pattern or the periodic surface structure of the HTL may be more or less beneficial for achieving the alignment effect.

For example, in order to promote the alignment of molecular axes, the pattern or surface structure of the HTL may have dimensions in the range of from 1 nm to 100 nm, or even smaller, e.g. from about 10 Å or 20 Å and up to 100 nm. Larger dimensions of the pattern or surface structure, e.g. up to 1 μm or even more, such as up to 100 μm may favor mainly an increase in light out coupling due to the combination with low refractive index, rather than promoting alignment of the emitter molecules. Thus, the optimum dimensions of the pattern or surface structure of the HTL may be different for different embodiments of the invention.

As used herein, "self-alignment" refers to the phenomenon of small molecules arranging themselves such that their molecular axes are aligned in a common preferred direction.

As used herein, "common preferred direction" refers to the phenomenon of anisotropy of a substance or material, and means the direction in which the molecular axes of the molecules of said substance or material (the emitter material) automatically tend to align (self-alignment) when subjected to particular conditions, such as the presence of a physical and/or chemical structure on which said material is deposited which induces the molecules to align. It is notable that the word "preferred" in this expression does not refer to an optional feature, but is a property of the material itself.

When the molecules of the emitter material are aligned, their molecular axes point in a general, common preferred direction. This common preferred direction may be substantially perpendicular to the layer plane, or it may be tilted with respect to the layer plane.

In conventional small molecule OLEDs (smOLEDs), the optical dipoles of the emitter molecules are arranged randomly in the emissive layer such that light is emitted in all directions and consequently some light is lost by light guiding. Polymeric OLEDs (PLEDs) however exhibit some degree of molecular order (alignment). Thus, while this embodiment of the invention will be most beneficial for application in smOLEDs, it can advantageously be used also in PLEDs to further increase the molecular order of the polymeric emitter material.

The surface structure of the HTL 103 may promote self-alignment of the molecular axes of the emitter material in a common preferred direction when the emissive layer 104 is applied on top of said structure. Self-alignment of the emitter molecules can be detected by known methods, e.g. as described in D. Yokoyama, M. Moriwake and C. Adachi, "Spectrally narrow emissions at cutoff wavelength from edges of optically and electrically pumped anisotropic organic films", Journal of Applied Physics 2008, 103, 123104.

Alternatively, the above described alignment of molecular axes and thus also of the optical dipoles can be achieved using a separate alignment layer adjacent the emissive layer, e.g. provided on the hole transport layer. An alignment layer may optionally be used in combination with a patterned or surface structured hole transport layer as described above.

Figure 4:
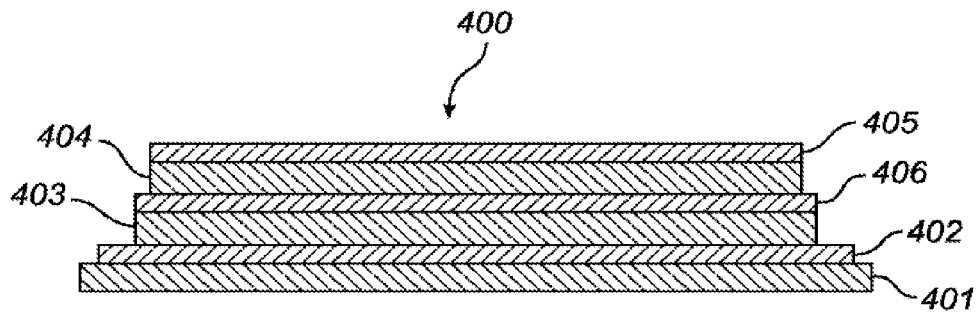
FIG. 4 shows a cross-sectional side view of part of a device according to another embodiment of the present invention.

FIG. 4 shows an OLED according to an embodiment of the invention, where said self-alignment of the emitter molecules is achieved by an alignment layer provided on the hole transport layer and in direct contact with the emissive layer. The device 400 comprises a substrate 401, an anode 402, a light emissive layer 404 and a cathode 405 as described above with reference to FIG. 1, a smooth hole transport layer 404 and arranged between the hole transport layer 403 and the emissive layer 404, a thin alignment layer 406 which promotes alignment of the emitter molecules.

In order not to limit the charge transport from to the light emissive layer, the alignment layer allows for charge transport, here hole transport, from the underlying charge transport layer to the emissive layer. Hence, the alignment layer of the present embodiments may be conductive or semiconductive. However, conventional alignment layer materials are often insulating materials. In order to allow for said charge transport, the alignment layer, which may comprise a conventional alignment layer material such as polyimide, may be made very thin, e.g. as a monolayer formed of a single layer of molecules. For such layers, the tunneling probability is high enough to provide acceptable charge transport. However, it is contemplated that the alignment layer may also be made conductive by chemical modification of the material.

The alignment layer may comprise conventional alignment layer materials such as polyimide or poly(phenylenevinylene). In embodiments where the alignment layer is a monolayer, it may be a self-assembled monolayer (SAM). Examples of a self-assembled monolayers include thiol-based, in particular acenethiol-based SAMs, such as anthracene-2-thiol SAMs. A study of the formation and structure of anthracene-2-thiol SAMs on gold substrate is presented in D. Käfer, G. Witte, P. Cyganik, A. Terfort and C. Wöll, "A comprehensive study of self-assembled monolayers of anthracencethiol on gold: effects, structure, and stability", J Am Chem Soc 2006, 128, 1723-1732.

The alignment layer may be treated, e.g. by rubbing or by photo irradiation (photoalignment), to provide a desired orientation of the molecules of the alignment layer.

The device of FIG. 4 may optionally comprise one or more additional organic layers as described above.

As mentioned above, self-alignment of the emitter molecules can be achieved by a combination of the hole transport layer 103 having a surface structure as described above with reference to FIG. 1 and use of the alignment layer 406 of FIG. 4. Thus, the alignment layer can be used in combination with either the smooth hole transport layer 403 of FIG. 4 or the structured hole transport layer 103 of FIG. 1.

The hole transport layer of the devices of the invention may be made of a conventional material having good hole transporting properties, such as PEDOT. It may be doped or undoped. Alternatively the hole transport layer may consist of vacuum deposited or printed small molecule material.

Furthermore, the present invention also provides a method for producing a devices as described herein. The method comprises:
a) providing a first electrode layer on a substrate to form the basis of a layer stack;
b) forming a charge transport layer on said layer stack;
c) patterning said charge transport layer or embossing said charge transport layer with a surface structure; or
   forming an alignment layer on said charge transport layer;
d) forming a light emissive layer on said patterned or embossed charge transport layer, or
   forming a light emissive layer on said alignment layer whereby molecular axes of molecules of said light emissive layer are aligned towards a common preferred direction; and
e) providing a second electrode layer on said layer stack.

The charge transport layer, typically a hole transport layer, may be formed directly on said first electrode, typically the anode. However, optionally one or more further organic layers may be provided between the first electrode and the charge transport layer, e.g. a charge injection layer, in particular a hole injection layer. In such embodiments, in one step the charge injection layer may be formed on the first electrode, and in a subsequent step the charge transport layer may be formed on the charge injection layer.

As described above, the patterning or embossing of the hole transport layer can be achieved by known patterning techniques, e.g. nanoimprint lithography. Such techniques are described in e.g. Jan Haisma et al., "Mold-assisted nanolithography: A process for reliable pattern replication", J Vac Sci Technol 1996, B 14(6) 4124-4128, Stephen Y. Chou et al., "Nanoimprint lithography", J Vac Sci Techno 1996, B 14(6) 4129-414133, Marc Verscuuren & Hans van Sprang, "3D photonic structures by sol-gel imprint lithography", Mater Res Soc Symp Proc 2007, 1002-NO3-05, and Helmut Schift, "Nanoimprint lithography: An old story in modern times? A review", J Vac Sci Technol 2008, B 26(2), 458-480.

In embodiments comprising both a patterned or surface structured hole transport layer and an alignment layer, the step c) may comprise both patterning or embossing the hole transport layer and subsequently applying the alignment layer on the hole transport layer.

In embodiments of the invention at least the hole transport layer in step c) may be formed by a conventional solution processing technique such as spin-coating, ink-jet printing, screen printing or dipping. In such embodiments the layer(s) to be applied by solution processing, e.g. the hole transport layer, is made from solution processable material. Typically said layer, e.g. the hole transport material which optionally may also include a dopant material, is provided as a solid and dissolved in organic solvents before being applied on the device stack.

Further, in such embodiments where at least the charge transport layer is formed by solution processing, at least one of steps e) and f) may be achieved by a vacuum processing technique, so as to produce a hybrid OLED.

The alignment layer of embodiments of the present invention may be formed by solution processing, typically by spin coating. Alternatively, in embodiments where the alignment layer is a monolayer, the monolayer may be applied by evaporation.

Furthermore, the alignment layer may be rubbed or subjected to photoalignment in order to provide a certain orientation of the alignment layer molecules, which in turn promotes a certain alignment of the molecules of the emissive layer applied subsequently.

The person skilled in the art realizes that the present invention by no means is limited to the preferred embodiments described above. On the contrary, many modifications and variations are possible within the scope of the appended claims. For example, it is contemplated that the OLED could be configured as a top emissive device. In such embodiments the charge transport layer that is patterned or provided with a periodic surface structure may be an electron transport layer provided between the cathode and the emissive layer, and any alignment layer may be provided between the electron transport layer and the emissive layer. Alternatively, in yet other embodiments the OLED stack may be flipped such that the cathode is the first electrode located on the substrate and the anode form a top layer of the device.

The invention claimed is:

1. A method of producing an organic light emitting device comprising the steps of:
    providing a first electrode layer on a substrate to form a layer stack;
    forming a charge transport layer on the layer stack;
    forming an optical alignment layer on the charge transport layer;
    forming a light emissive layer on the alignment layer, the light emissive layer comprises modules, wherein each of the molecules of the light emissive layer have an axis, wherein the axes are aligned towards a common direction; and
    disposing a second electrode layer over the light emissive layer.

2. The method according to claim 1, wherein the forming of the charge transport layer is performed using a solution processing technique.

3. The method according to claim 1, wherein forming the light emissive layer is performed using a vacuum processing technique.

4. The method according to claim 1, wherein forming the second electrode layer is performed using a vacuum processing technique.

5. The method according to claim 1, further comprising embossing the charge transport layer with a surface structure.

6. The method according to claim 5, wherein the embossing is performed using a nanoimprint technique.

7. The method according to claim 1, further comprising patterning the charge transport layer with a surface structure.

8. The method according to claim 7, wherein the patterning of the charge transport layer is arranged to produce a discontinuous layer.

9. The method according to claim 1, wherein the alignment layer promotes the alignment of the optical dipoles of the molecules of the light emissive layer.

* * * * *